United States Patent
Shin et al.

(10) Patent No.: US 6,836,390 B2
(45) Date of Patent: Dec. 28, 2004

(54) HARD DISK DRIVE COMPRISING A FLEXIBLE PRINTED CIRCUIT WITH A HOLE

(75) Inventors: Sang-chul Shin, Osan-si (KR); Woo-cheol Jeong, Anyang-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 58 days.

(21) Appl. No.: 10/288,475

(22) Filed: Nov. 6, 2002

(65) Prior Publication Data

US 2003/0086213 A1 May 8, 2003

(30) Foreign Application Priority Data

Nov. 6, 2001 (KR) ......................................... 2001-68819

(51) Int. Cl.[7] ........................ G11B 25/04; G11B 33/14
(52) U.S. Cl. ................................ 360/264.2; 360/245.9
(58) Field of Search ........................... 360/266.3, 245.9, 360/246, 264.2

(56) References Cited

U.S. PATENT DOCUMENTS

| | | | | |
|---|---|---|---|---|
| 5,446,240 A | * | 8/1995 | Hayakawa et al. | ............ 171/69 |
| 5,598,307 A | * | 1/1997 | Bennin | ..................... 360/245.9 |
| 5,612,840 A | * | 3/1997 | Hiraoka et al. | ........... 360/245.9 |
| 5,712,749 A | * | 1/1998 | Gustafson | .................... 360/246 |
| 5,859,749 A | * | 1/1999 | Zarouri et al. | ........... 360/245.9 |
| 5,864,446 A | * | 1/1999 | Endo et al. | ............... 360/244.6 |
| 5,870,258 A | * | 2/1999 | Khan et al. | ............... 360/245.9 |
| 5,995,329 A | * | 11/1999 | Shiraishi et al. | ......... 360/245.9 |
| 2002/0181156 A1 | * | 12/2002 | Shiraishi et al. | ......... 360/245.9 |

FOREIGN PATENT DOCUMENTS

| | | |
|---|---|---|
| JP | 5-74122 | 3/1993 |
| JP | 5-250854 | 9/1993 |

* cited by examiner

*Primary Examiner*—David Ometz
(74) *Attorney, Agent, or Firm*—Staas & Halsey LLP

(57) ABSTRACT

A hard disk drive is formed of head signal patterns, voltage patterns, a ground pattern, and a current pattern, and characterized in having a flexible printed circuit (FPC) with a hole between the head signal patterns, and the voltage patterns, the ground pattern, and the current pattern. The effect of noise on the head signal patterns is reduced in the provided hard disk drive, and vibration energy at a specific low frequency band is reduced to minimize effects on a servo control and to improve overall performance of the hard disk drive.

14 Claims, 13 Drawing Sheets

HARD DISK DRIVE COMPRISING A FLEXIBLE PRINTED CIRCUIT WITH A HOLE

CROSS-REFERENCE TO RELATED APPLICATIONS

This application claims the benefit of Korean Application No. 2001-68819, filed Nov. 6, 2001, in the Korean Intellectual Property Office, the disclosure of which is incorporated herein by reference.

BACKGROUND OF THE INVENTION

1. Field of the Invention

The present invention relates to a hard disk drive, and more particularly, to a hard disk drive comprising a flexible printed circuit to minimize vibration energy of noise.

2. Description of the Related Art

A hard disk drive is an auxiliary memory device of a computer to write and read information on a magnetic disk by using a magnetic head.

FIG. 1 illustrates the structure of a conventional hard disk drive 20. Referring to FIG. 1, the conventional hard disk drive includes a disk 13 to store information, a spindle motor 15 to rotate the disk 13, an actuator 23 having a magnetic head 25 to write and reproduce information on and from the disk 13, a voice coil motor 21 to drive the actuator 23, a flexible printed circuit (FPC) 11 to transfer an electric signal from a printed circuit board (PCB) (not shown) to the actuator 23, and a bracket 31 to support the FPC 11.

The disk 13 is formed of a parking zone micro-processed by a laser at an inner region of the disk 13 and a data zone at the outer circumference of the parking zone to write magnetic signals. The disk 13 is coupled with the spindle motor 15 to mount the magnetic head 25 in a power-off state. Servo signals to report the location of information to be written are pre-written on tens of thousands of concentric tracks on the disk 13.

The actuator 23 includes a fantail unit 19 having the voice coil motor 21 to drive the actuator 23, a pivot bearing 17 as a rotating center for the actuator 23, and the magnetic head 25 having a write head to write data on the disk 13 and a read head to reproduce information from the disk 13.

The PCB transfers electric signals to the FPC 11 so the FPC 11 can transfer the electric signals to the actuator 23. The electric signals are transferred from the actuator 23 to the voice coil motor 21. The actuator 23 is rotated centering upon the pivot bearing 17 by electromagnetic force from interaction between electric current and magnets in the voice coil motor 21. Accordingly, the actuator 23 moves from the parking zone to the data zone.

FIG. 2 illustrates the structure of the conventional FPC 11. Referring to FIG. 2, head signal patterns (RDX; Read Data X, RDY; Read Data Y, WDX; Write Data X, WDY; Write Data Y) to transfer and/or receive the electric signals to and from the magnetic head through a pre-amplifier (not shown), voltage patterns (VDD; positive DC supply and VSS; negative DC supply) to supply voltage to the pre-amplifier, a ground (GND) to ground, and a current pattern (VC; Voice coil) to apply current to the voice coil motor 21, are arranged on the conventional FPC 11.

In the case of writing and/or reading data in the hard disk drive 20, the magnetic head 25 is positioned above the tracks of the rotating disk 13 to write and/or read data. It is most preferable that the track of the rotating disk 13 forms an exact circle, and the magnetic head 25 precisely writes and reads data. However, in reality, the disk 13 rotates in a distorted circular shape caused by vibration of the spindle motor 15. Accordingly, displacement between the track and the magnetic head, known as runout, occurs.

Two kinds of runout include repeatable runout (RRO), which repeats every rotation and non-repeatable runout (NRRO), which does not repeat every rotation.

In RRO, the rotation of the disk 13 forms a waveform with a specific period caused by the assembly deflection of the disk 13 or vibration of the hard disk drive 20. Since the waveform is periodical, location difference between the track and the magnetic head 25 can be compensated for by recording waveform information in a servo.

In order to compensate for RRO and test reliability, a burn-in test is performed in a process of manufacturing the hard disk drive by varying conditions such as temperature and voltage. However, it is difficult to completely compensate for RRO because the effects of various factors like FPC bias, windage bias, and heat, in the manufacturing process, are complicated. The FPC bias means the force applied from the FPC to a head stack assembly (HSA). The windage bias means the force applied to the HSA according to the effect from rotating fluctuation of the disk to the FPC.

In the FPC 11, since the head signal patterns RDX, RDY, WDX, and WDY are physically close to the current pattern VC and the voltage patterns VDD and VSS through which a relatively large current flows, noise affects the head signal patterns RDX, RDY, WDX, and WDY. In addition, a low frequency of about 340 Hz caused by the characteristic frequency of the FPC 11 affects a servo control.

Especially, since the write head signal patterns WDX and WDY are nearer to the voltage patterns VDD and VSS and the current pattern VC than to the read head signal patterns RDX and RDY, the effects are much more serious in a write mode than in a read mode.

Consequently, since the compensation values for RRO vary according to operating environment and the kind of the hard disk drive, the performance of the hard disk drive is affected by disturbances like NRRO and low frequencies of under 1 kHz which are not a servo control region of the FPC. NRRO means the rotation of the disk to form a distorted waveform without a specific period.

Referring to FIG. 3, a frequency response graph of the conventional FPC illustrates a current strength peak at around 340 Hz. The peak is generated by resonance between the characteristic frequency of the conventional FPC and the same frequency of noise. In this case, the vibration energy of the same frequency of the noise is strongly generated by resonance.

Thus, since a seek time and position error signal (PES) of the conventional hard disk drive are increased by the noise effect from the current pattern VC and the voltage patterns VDD and VSS, the difference between RRO compensation values, and the effect from low frequencies, the performance and yield rate of the conventional hard disk drive are deteriorated.

SUMMARY OF THE INVENTION

Accordingly, it is an object of the present invention to provide a hard disk drive having an improved flexible printed circuit (FPC) to minimize vibration energy at a specific frequency band generated in the FPC and to reduce the effects of noise on head signal patterns, thereby minimizing external effects on servo control.

Additional objects and advantages of the invention will be set forth in part in the description which follows and, in part, will be obvious from the description, or may be learned by practice of the invention.

The foregoing and other objects of the present invention are achieved by providing a hard disk drive having an actuator with a magnetic head to write and read information to and from a disk, a voice coil motor to drive the actuator, an FPC to transfer electric signals to the actuator and the voice coil motor, and a bracket to support the FPC, includes the FPC formed of head signal patterns, voltage patterns, a ground pattern, and a current pattern, wherein a hole is formed between the head signal patterns, and the voltage patterns, the ground pattern, and the current pattern.

In an aspect of the present invention, the starting point of non-contact between the FPC and the bracket, and the starting point of non-contact between the FPC and the actuator are arranged with the hole therebetween.

In another aspect, the hole is a slot aligned with the signal patterns or the holes are slots aligned with the signal patterns.

In yet another aspect, the edges of the slot are formed in a round shape.

According to the present invention, a hole is formed between the head signal patterns, and the voltage, ground, and current patterns in the FPC to reduce the effects of noise from voltage, ground, and current signals on head signals. In addition, vibration energy of about 340 Hz caused by the characteristic frequency of the FPC, and vibration energy applied from outside are reduced.

BRIEF DESCRIPTION OF THE DRAWINGS

These and other objects and advantages of the invention will become apparent and more readily appreciated from the following description of the embodiments, taken in conjunction with the accompanying drawings of which.

DETAILED DESCRIPTION OF THE INVENTION

Figure 1:
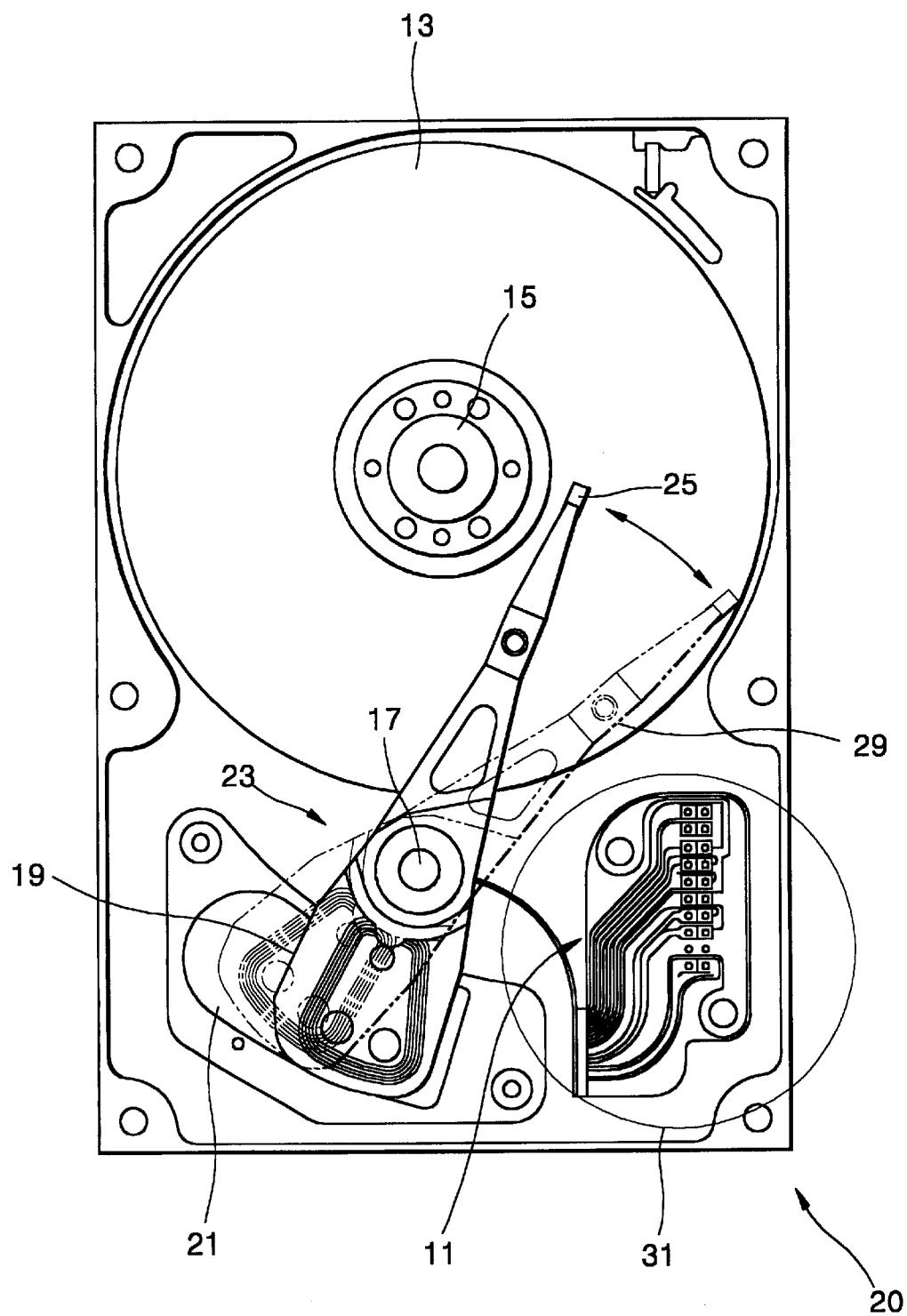
FIG. 1 is a plane view illustrating the structure of a conventional hard disk drive.
Figure 2A:
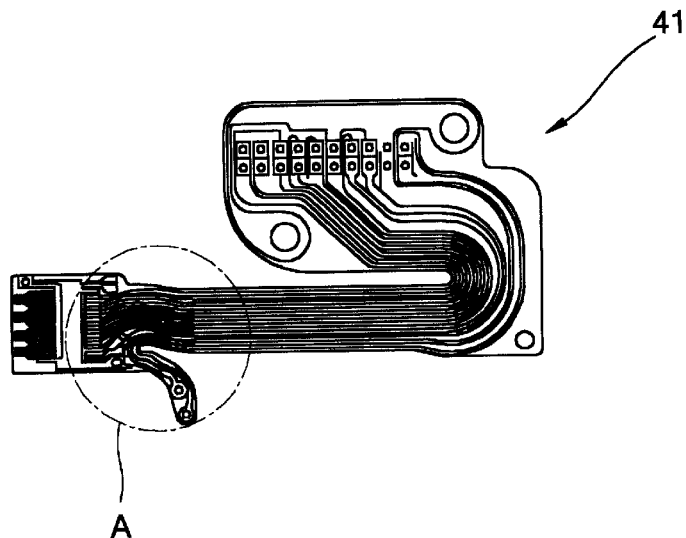
FIG. 2A is a plane view illustrating a conventional flexible printed circuit (FPC)
Figure 2B:
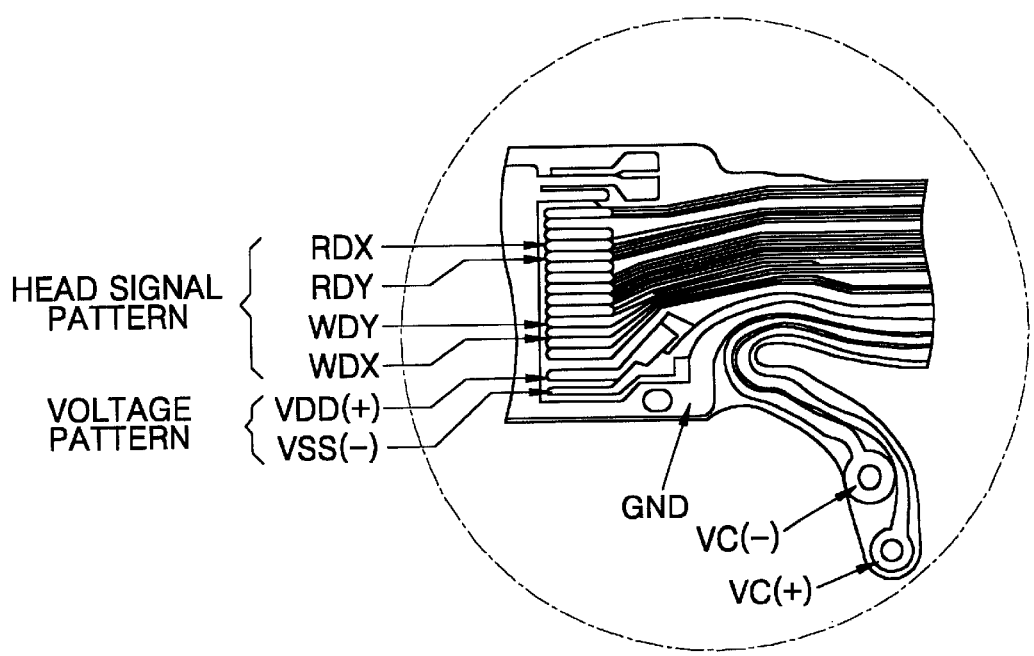
FIG. 2B is an enlarged view illustrating a portion A of FIG. 2A.

Reference will now be made in detail to the embodiments of the present invention, examples of which are illustrated in the accompanying drawings, wherein like reference numerals refer to like elements throughout. The embodiments are described below in order to explain the present invention by referring to the figures.

Figure 4A:
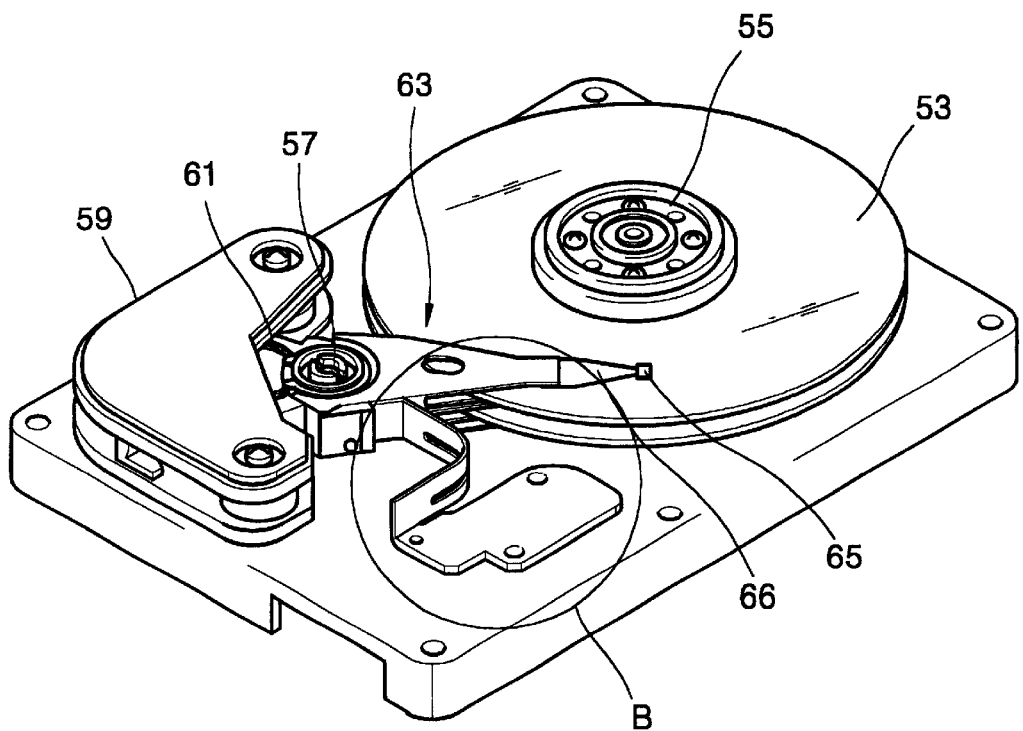
FIG. 4A is a perspective view of a hard disk drive according to an embodiment of the present invention.
Figure 4B:
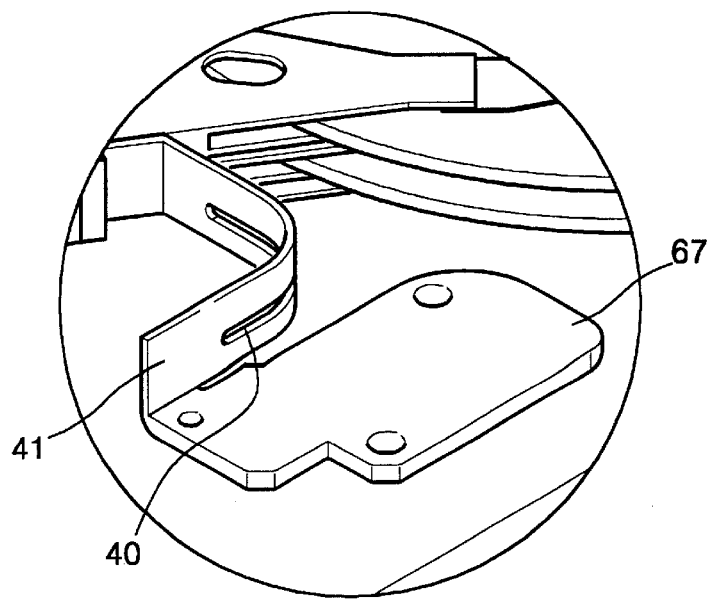
FIG. 4B is an enlarged view illustrating a portion B of FIG. 4A.

FIGS. 4A–4B illustrate a hard disk according to an embodiment of the present invention. Referring to FIGS. 4A–4B, the hard disk drive includes an actuator 63 having a magnetic head 65 to write and/or read information to/from a disk 53, a voice coil motor 61 to drive the actuator 63, an FPC 41 having head signal, voltage, ground, and current patterns to transfer electric signals to the actuator 63 and the voice coil motor 61 and having a hole 40 between the head signal patterns, and the voltage, ground, and current patterns, and a bracket 67 to support the FPC 41.

The FPC 41 fixed to the bracket 67 connects a printed circuit board (PCB) (now shown) to the actuator 63 to transfer the electric signals. The FPC 41 is formed in triple-layer stack structure of base, circuit and cover layers. Here, the base and cover layers are formed with the circuit layer therebetween. The head signal patterns RDX, RDY, WDX, and WDY, the voltage patterns VDD and VSS, the ground pattern GND, and the current pattern VC are arranged on the FPC 41.

A suspension 66 having the magnetic head 65 facing the disk 53 is located at an end of the actuator 63, and the voice coil motor 61 is located at the opposite end of the actuator 63. Consequently, the actuator 63 is driven according to interaction between current signals transferred from the FPC 41 and the magnetic field of the magnets. The actuator 63 is rotated centering upon a pivot shaft 57 by the rotation of the voice coil motor 61, thereby moving the magnetic head 65 to a predetermined location.

When power is applied to the hard disk drive, a spindle motor 55 is rotated to rotate the disk 53 mounted on the spindle motor 55. When the rotating speed of the disk 53 exceeds a predetermined value, the magnetic head 65 floats above the disk 53 by pneumatic pressure between the disk 53 and the magnetic head 65, thus maintaining a fine gap from the disk 53. The electric signals transferred from the PCB pass through the FPC 41 and are transferred to the actuator 63 and the voice coil motor 61, thereby driving the actuator 63.

The magnetic head 65 reads a pre-written servo signal by using a read head to receive the electric signals transferred from the FPC 41 in moving toward a predetermined track. Accordingly, the magnetic head 65 writes information on the disk 53 by using a write head or reads information from the disk 53 by using the read head to transfer the information to the PCB through the FPC 41.

Figure 5A:
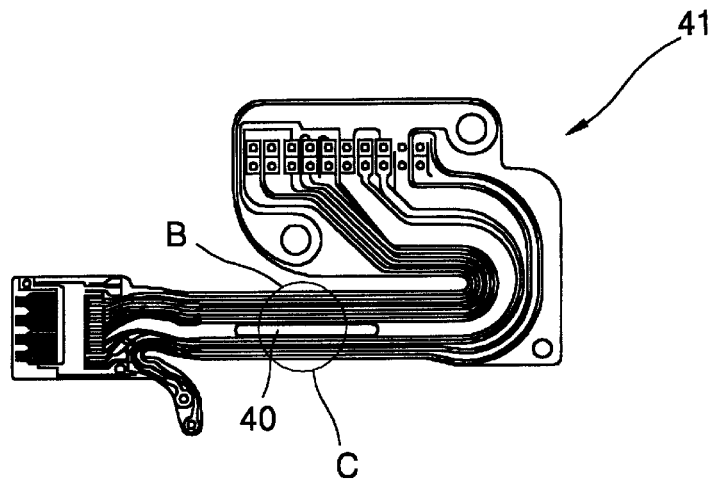
FIG. 5A is a plane view illustrating the FPC of the hard disk drive according to the embodiment of FIG. 4A.
Figure 5B:
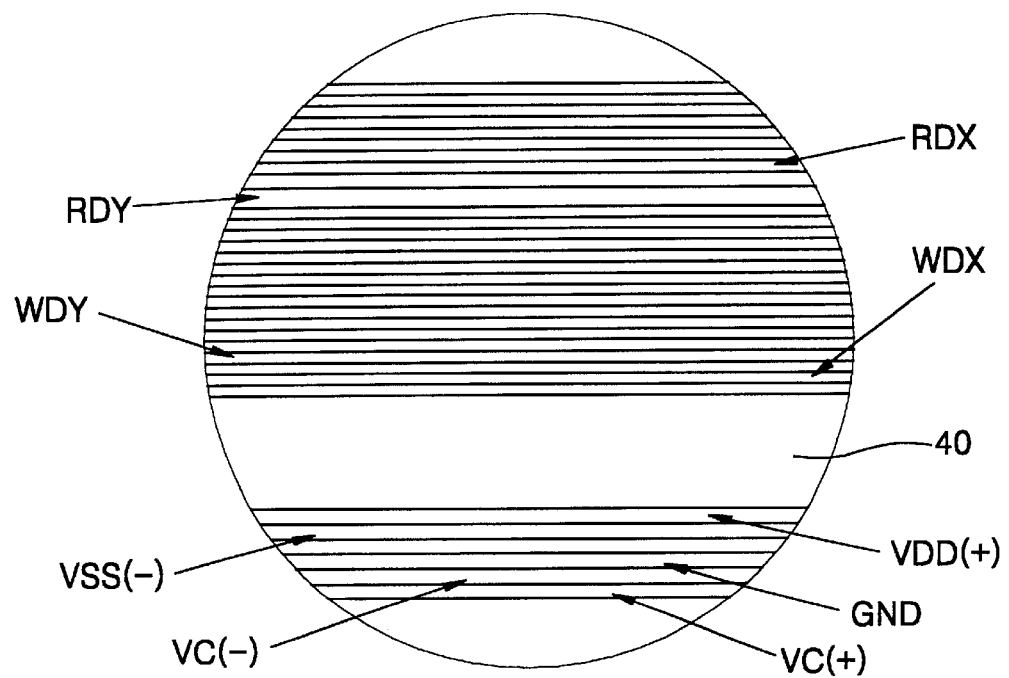
FIG. 5B is a detailed view of the wiring patterns in portion C of the FPC illustrated in FIG. 5A.

FIGS. 5A–5B illustrate the FPC of the hard disk drive according to the embodiment of FIG. 4A. Referring to FIGS. 5A–5B, a slot type hole 40 is formed between the head signal patterns RDX, RDY, WDX, and WDY, and the voltage patterns VDD and VSS, the ground pattern GND, and the current pattern VC on the FPC 41 of the hard disk drive.

A starting point of non-contact between the FPC 41 and the bracket 67, and a starting point of non-contact between the FPC 41 and the actuator 63 are formed with the hole 40 therebetween.

According to the hole on the FPC 41, bias caused by the FPC 41 is reduced while reducing noise in the head signals of the magnetic head 65 caused by the current pattern VC and the voltage patterns VDD and VSS connected to the voice coil motor 61. In addition, the vibration energy at a 340 Hz frequency band, which causes problems in writing information on the disk 53 by using the magnetic head 65, is reduced.

The edges of the hole 40 are formed in a round shape to prevent breakage of the hole by external stress.

The FPC 41 is connected to a pre-amplifier formed in the bracket 67 of the PCB to connect signal cables (not shown) transmitting electric signals to the magnetic head 65 and current terminals of the voice coil motor 61 with terminals of the PCB.

The strength and mass of the FPC 41 having the hole are lower than the strength and mass of the FPC without the hole, but a boundary condition of the FPC is maintained. Consequently, the characteristic frequency of the FPC 41 at about 340 Hz frequency band is maintained.

The FPC 41 of the hard disk drive according to the embodiment of FIG. 4A diverges the vibration energy, which is input to the FPC 41 or generated from the FPC 41, by using the hole formed on the FPC 41 to reduce vibration level. Especially, the vibration energy at the frequency band of 340 Hz is prominently reduced in the FPC so that the magnetic head may be not replaced from a track.

In addition, in the FPC 41 of the hard disk drive, the hole is formed between the head signal patterns RDX, RDY, WDX, and WDY, and the voltage patterns VDD and VSS, the ground pattern GND, and the current pattern VC. As a result, an effect of noise from the head signal patterns RDX, RDY, WDX, and WDY on the voltage patterns VDD and VSS, the ground pattern GND, and the current pattern VC is reduced.

The FPC 41 of the hard disk drive according to the embodiment of FIG. 4A has a smaller elasticity than the conventional FPC without the hole. Consequently, bias force is reduced so as to reduce power consumption of the voice coil motor.

Figure 6A:
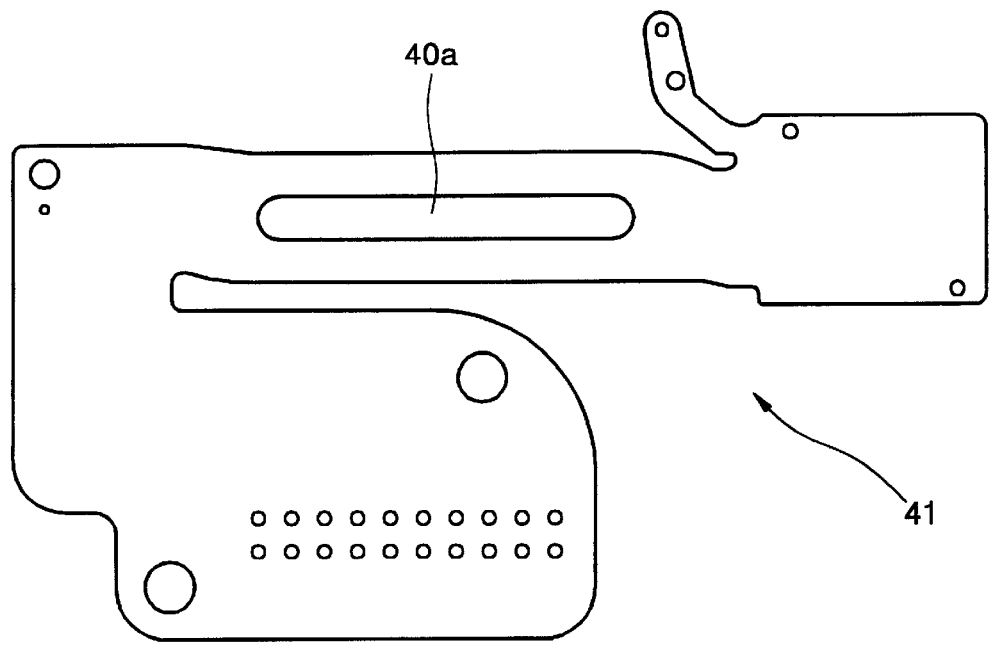
FIGS. 6A, 6B, and 6C are sectional views illustrating examples of holes formed on the FPC of the hard disk drive according to the embodiment of FIG. 4A.
Figure 6B:
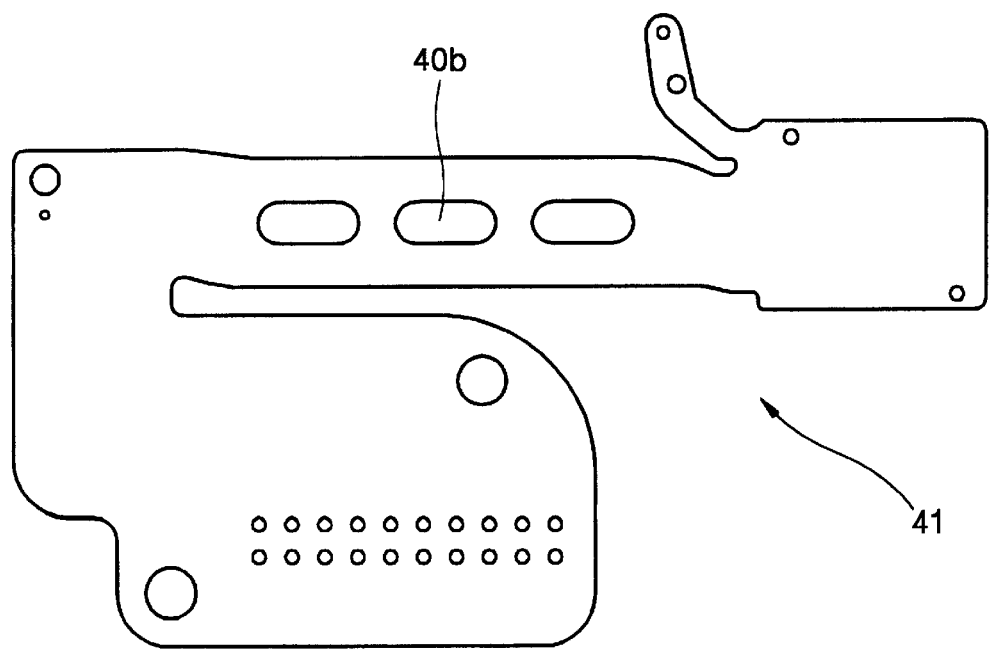
Figure 6C:
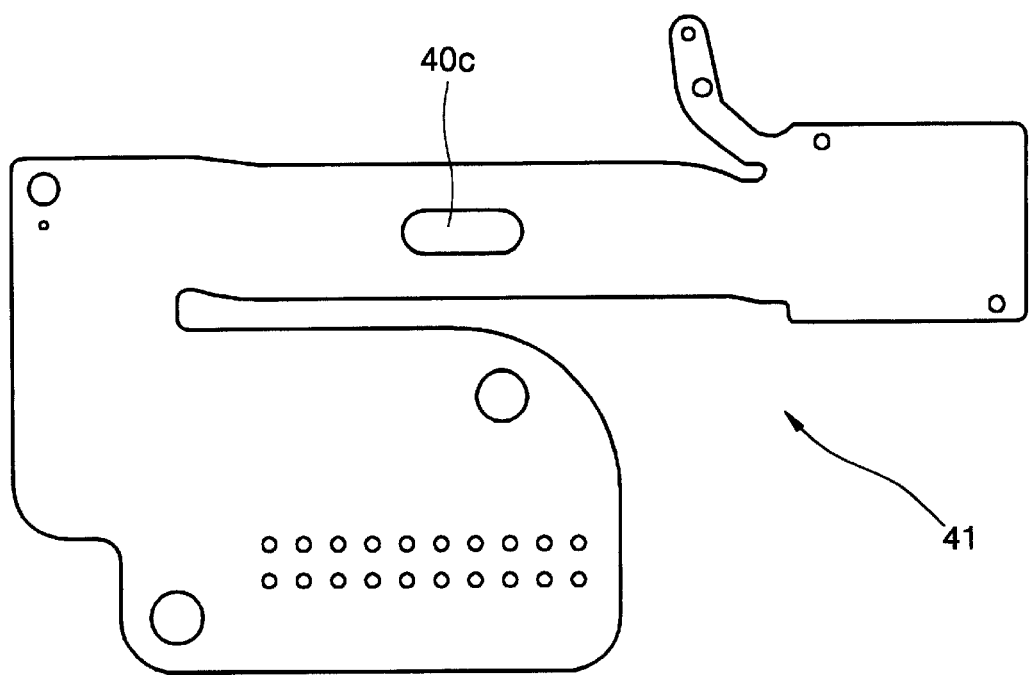

FIGS. 6A, 6B, 6C illustrate examples of the hole formed on the FPC of the hard disk drive according to the embodiment of FIG. 4A.

Referring to FIG. 6A, the starting point of non-contact between the FPC 41 and the bracket 67, and the starting point of non-contact between the FPC 41 and the actuator 63 are arranged with a slot-shape hole 40a therebetween.

Referring to FIG. 6B, the starting point of non-contact between the FPC 41 and the bracket 67, and the starting point of non-contact between the FPC 41 and the actuator 63 are arranged with three slot-shape holes 40b therebetween.

Referring to FIG. 6C, the starting point of non-contact between the FPC 41 and the bracket 67, and the starting point of non-contact between the FPC 41 and the actuator 63 are arranged with a slot-shape hole 40c smaller than the hole 40a in FIG. 6A therebetween.

The size and number of holes are determined so as to reduce the low frequency element prominently affected to the FPC 41 according to the environment of the hard disk drives. For example, in order to reduce the vibration energy at 740 Hz frequency band, it is an aspect of the invention that a hole having a size of half of the hole to reduce the vibration energy at 340 Hz frequency band is formed.

Figure 7A:
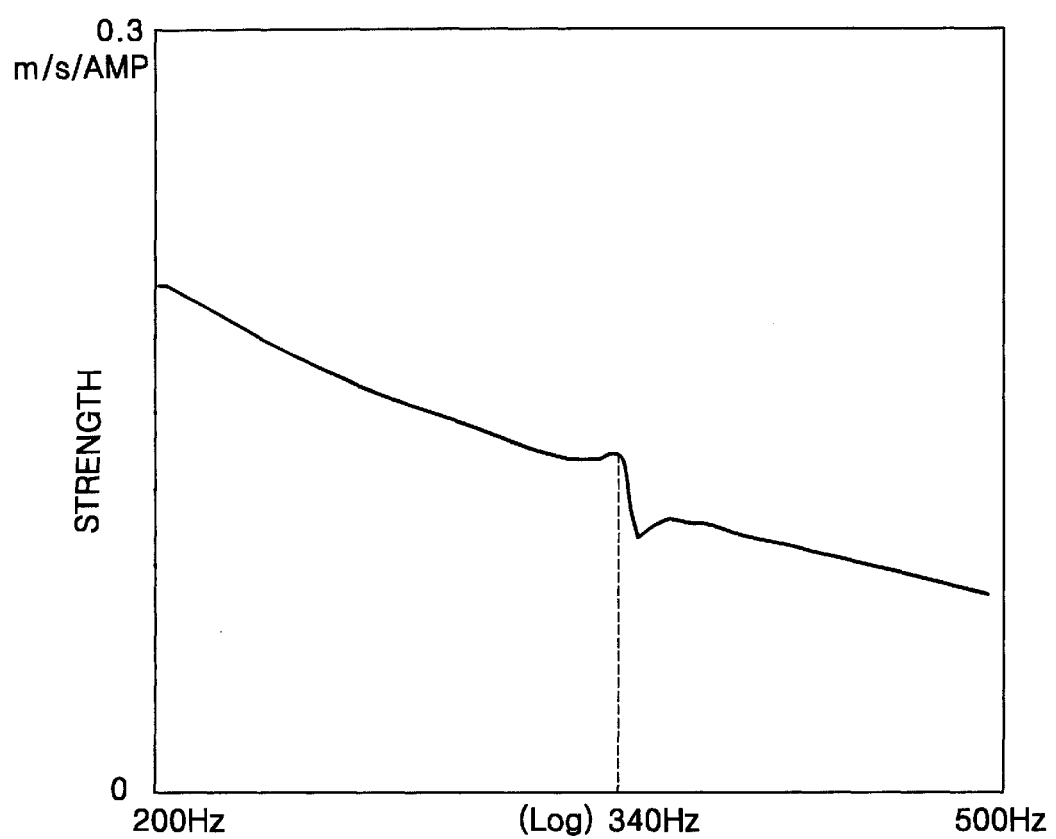
FIGS. 7A, 7B, and 7C are graphs illustrating frequency response of the FPC of the hard disk drive according to the embodiment of FIG. 4A at a frequency band of 340 Hz.
Figure 7B:
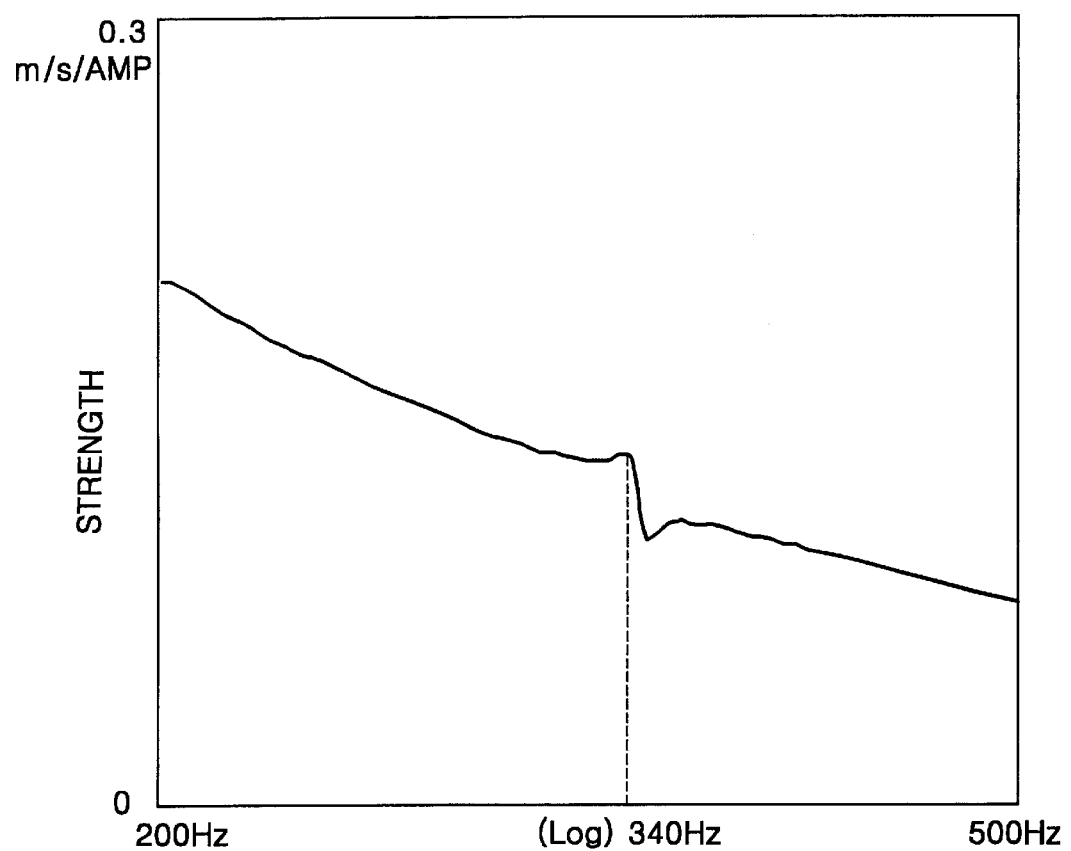
Figure 7C:
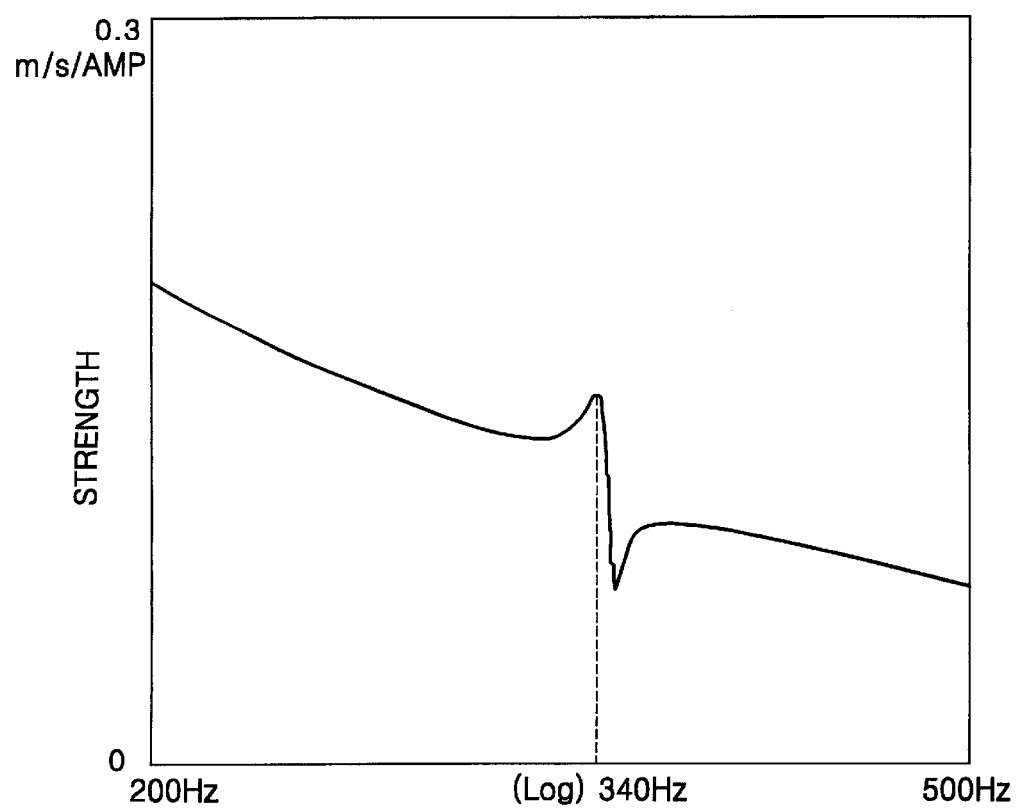

FIG. 7A illustrates a frequency response of the FPC having the slot shown in FIG. 6A at the 340 Hz frequency band. FIG. 7B illustrates a frequency response of the FPC having the slots shown in FIG. 6B at the same frequency band. FIG. 7C illustrates the frequency response of the FPC having the slot shown in FIG. 6C at the same frequency band.

Figure 3:
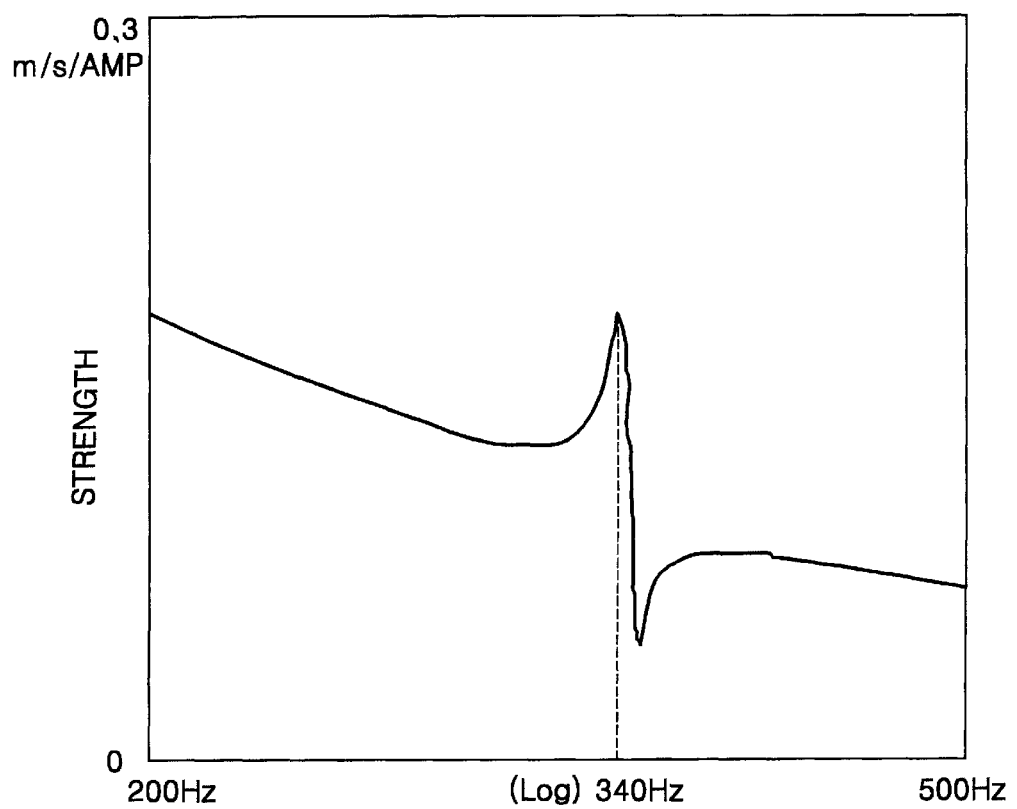
FIG. 3 is a graph illustrating frequency response of the conventional FPC.

In comparing the frequency responses at the 340 Hz frequency band shown in FIGS. 7A, 7B, and 7C to the frequency response of the FPC without the hole shown in FIG. 3, the current strengths of the frequency responses shown in FIGS. 7A, 7B, and 7C are prominently reduced. There is not considerable difference among the current strengths of the frequency responses shown in FIGS. 7A, 7B, and 7C.

Figure 8A:
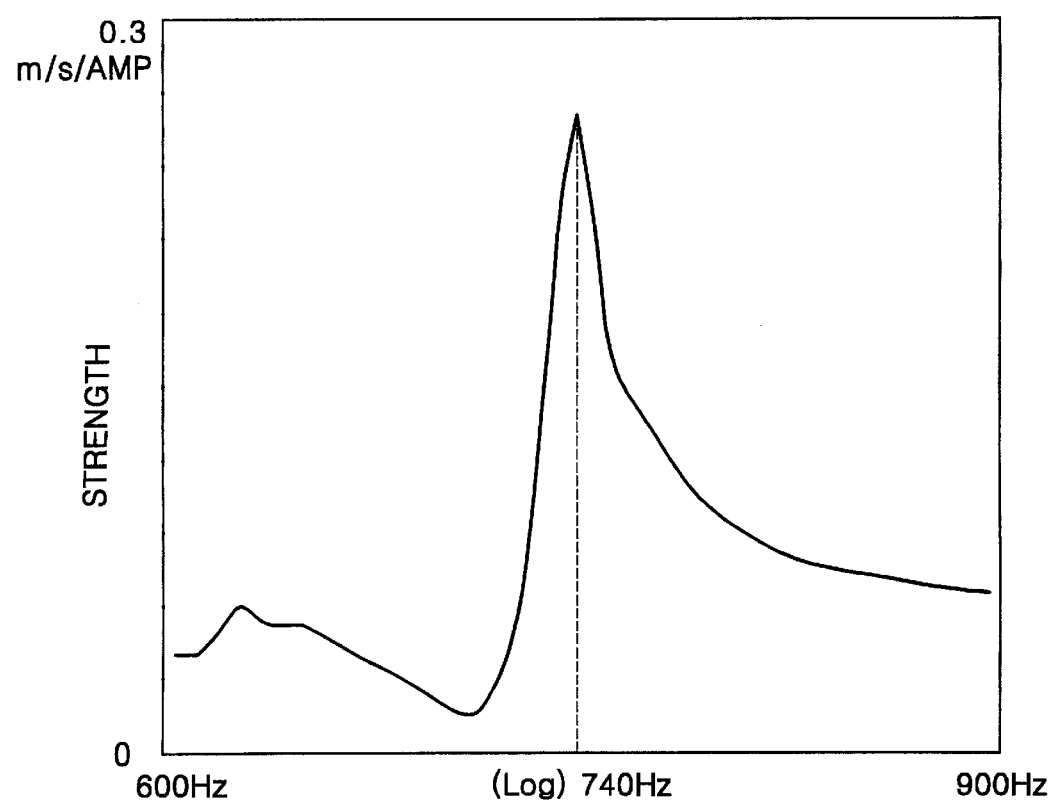
FIGS. 8A, 8B, and 8C are graphs illustrating frequency response of the FPC of the hard disk drive according to the embodiment of FIG. 4A at a frequency band of 740 Hz.
Figure 8B:
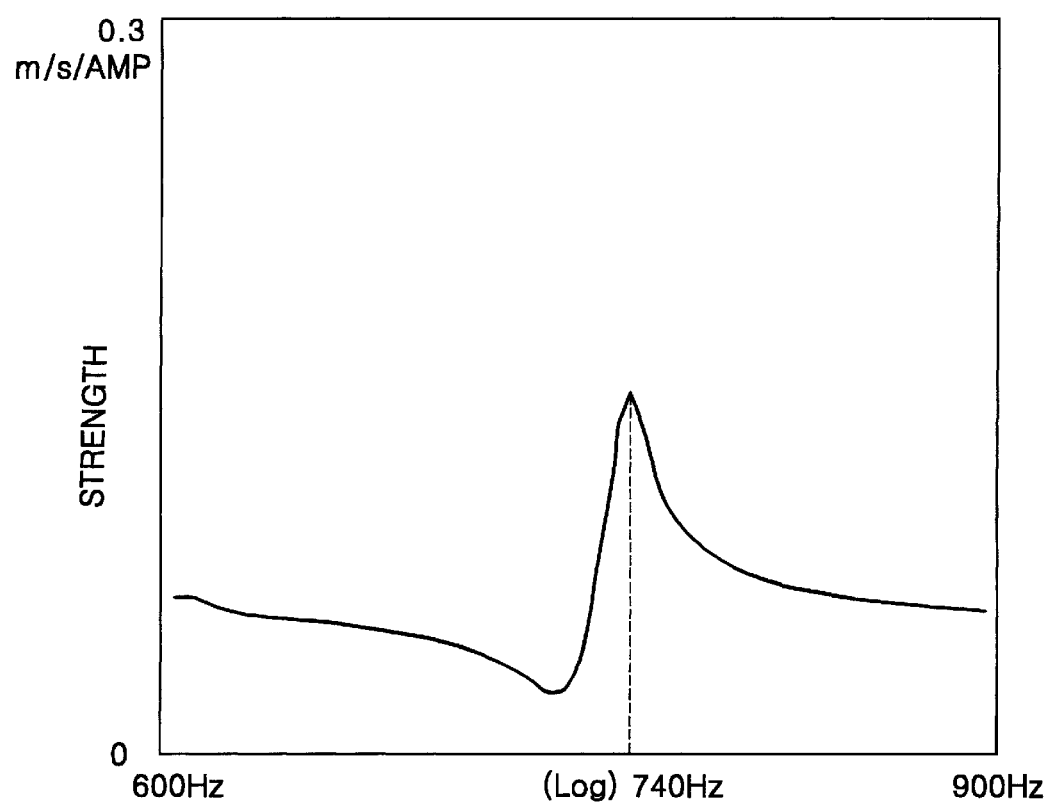
Figure 8C:
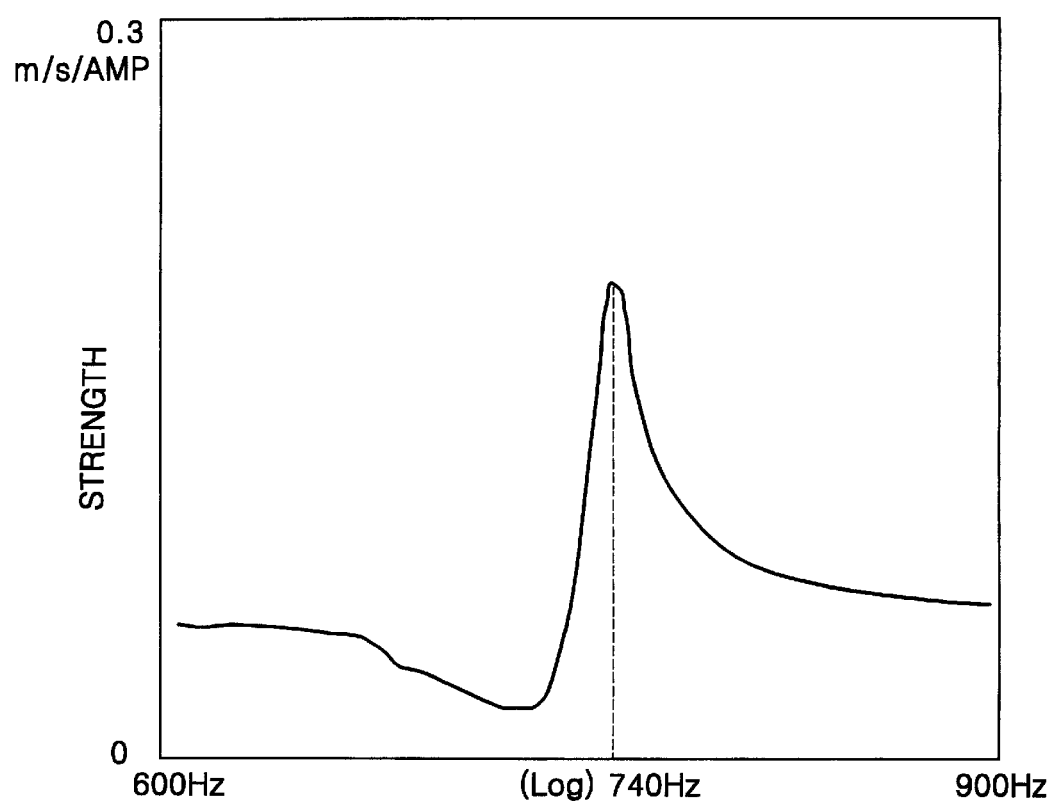

FIG. 8A illustrates a frequency response of the FPC having the slot shown in FIG. 6A at the 740 Hz frequency band. FIG. 8B illustrates a frequency response of the FPC having the slots shown in FIG. 6B at the same frequency band. FIG. 8C illustrates the frequency response of the FPC having the slot shown in FIG. 6C at the same frequency band.

Referring to FIGS. 8A, 8B, and 8C, the strength of the frequency response in the FPC having the slot shown in FIG. 6A is the largest, and the strength of the frequency response in the FPC having the slots shown in FIG. 6B is the smallest.

In comparing the FPCs shown in FIGS. 6A and 6B, the FPC shown in FIG. 6B reduces the vibration energy better than the FPC shown in FIG. 6A by 40%. In addition, the FPC shown in FIG. 6C reduces the vibration energy better than the FPC shown in FIG. 6A by 26%. Consequently, it is preferable that the holes are formed to diverge the vibration in order to avoid the characteristic frequency of the FPC.

On the FPC 41 according to the embodiment of FIG. 4A, the preferable number and size of holes are formed between the head signal patterns, and the voltage patterns, the ground pattern, and the current pattern to reduce the vibration energy at a specific low frequency band. Therefore, the noise effect applied from the voltage patterns, the ground pattern, and the current pattern to the head signal patterns is reduced.

In addition, the FPC 41 according to the embodiment of FIG. 4A has the hole so that the strength, mass, elasticity, and bias force are reduced, and the vibration level of the vibration energy input from outside or induced from the FPC 41 is reduced. Therefore, the effect of vibration in servo control of the hard disk is minimized, thereby conveniently controlling the actuator.

It will be understood by those skilled in the art that various changes in form and details may be made therein like different size and number of holes are formed at different positions of the FPC to reduce the vibration energy.

As described above, the FPC according to the present invention reduces the vibration energy at a specific frequency band to minimize effect of the vibration energy on servo control, and reduces noise to the head signal to conveniently control the location of the actuator. As a result, the entire performance of the hard disk drive is improved.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A hard disk drive having an actuator with a magnetic head to write and read information to and from a disk, a voice coil motor to drive the actuator, a flexible printed circuit (FPC) to transfer electric signals to the actuator and the voice coil motor, and a bracket to support the FPC, the hard disk drive further comprising:

the FPC formed of head signal patterns, voltage patterns, a ground pattern, and a current pattern, wherein a hole is formed between the head signal patterns, and the voltage patterns, the ground pattern, and the current pattern.

2. The hard disk drive of claim 1, wherein the starting point of non-contact between the FPC and the bracket, and the starting point of non-contact between the FPC and the actuator are arranged with the hole therebetween.

3. The hard disk drive of claim 1, wherein the hole is a slot aligned with the signal patterns.

4. The hard disk drive of claim 1, wherein the hole comprises slots aligned with the signal patterns.

5. The hard disk drive of claim 3, wherein the edges of the slot are formed in a round shape.

6. The hard disk drive of claim 4, wherein the edges of the slots are formed in a round shape.

7. The hard disk drive of claim 2, wherein the hole is a slot aligned with the signal patterns.

8. The hard disk drive of claim 2, wherein the hole comprises slots aligned with the signal patterns.

9. The hard disk drive of claim 7, wherein the edges of the slot are formed in a round shape.

10. The hard disk drive of claim 8, wherein the edges of the slots are formed in a round shape.

11. A hard disk drive having an actuator to write and read information to and from a disk, and a voice coil motor controlling the actuator, the hard disk drive further comprising:

a bracket connected with a printed circuit board; and an FPC formed of electrical circuit patterns and connected to the PCB at one end through the bracket and to the actuator at the other end, wherein at least one hole is formed in the FPC between predetermined ones of the circuit patterns to reduce noise and vibration energy.

12. The hard disk drive of claim 11, wherein a starting point of non-contact between the FPC and the bracket, and the starting point between the FPC and the actuator are arranged with a slot-shaped hole therebetween.

13. The hard disk drive of claim 11, wherein a starting point of non-contact between the FPC and the bracket, and the starting point between the FPC and the actuator are arranged with three slot-shaped holes therebetween.

14. The hard disk drive of claim 11, wherein one of the at least one hole has a size of half of a hole that would reduce the vibration energy at 340 Hz frequency band is formed in the FPC in order to reduce the vibration energy at 740 Hz frequency band.

* * * * *